United States Patent
Matsuo (10) Patent No.: US 7,329,818 B2
(45) Date of Patent: Feb. 12, 2008

(54) TRANSMISSION CIRCUIT BOARD

(75) Inventor: Tsutomu Matsuo, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 138 days.

(21) Appl. No.: 11/201,104

(22) Filed: Aug. 11, 2005

(65) Prior Publication Data

US 2006/0042828 A1    Mar. 2, 2006

(30) Foreign Application Priority Data

Aug. 30, 2004  (JP) ............... 2004-249442

(51) Int. Cl.
- *H01R 12/04* (2006.01)
- *H05K 1/11* (2006.01)

(52) U.S. Cl. ..................... 174/261; 361/794
(58) Field of Classification Search ............... 174/261; 361/777–779, 792–795
See application file for complete search history.

(56) References Cited

FOREIGN PATENT DOCUMENTS

| JP | 11-74399 | 3/1999 |
|---|---|---|
| JP | 2000-216509 | * 8/2000 |

OTHER PUBLICATIONS

Machine Translation of JP2000-216509.*
Abstract of JP2000-216509.*
U.S.A. Altera Technical Bulletin "Board Design Guidelines for LVDS Systems" (Jul. 2000).

* cited by examiner

*Primary Examiner*—Jeremy C Norris
(74) *Attorney, Agent, or Firm*—Takeuchi & Kubotera, LLP (57) ABSTRACT

In a transmission circuit board, ground terminal portions (10) are disposed at every other two rows in both end columns. Each of signal circuit layers (20) includes at least a pair of adjacent signal connecting portions electrically connected to a pair of the wiring portions (21, 22) arranged in parallel in a row direction and the column direction different from those on an adjacent signal circuit layer. Each of the ground layers is electrically connected to at least one of the ground terminal portions (10) in the both end columns.

11 Claims, 9 Drawing Sheets

TRANSMISSION CIRCUIT BOARD

TECHNICAL FIELD

The present invention relates to a transmission circuit board, especially a structure of a transmission circuit board suitable for high-speed transmission. The present invention also relates to a connector device having a connector connected to the transmission circuit board.

BACKGROUND TECHNOLOGY

As IT products have become more sophisticated, in order to process a larger amount of data in a short period of time, bits of data to be transmitted at a time have been increased, and a clock frequency has been increased. Recently, parallel transmission has been shifted to serial transmission (one-to-one transmission).

In the serial transmission, the clock frequency has been further increased to the Gbps band. A method of transmission has been shifted from conventional serial end transmission to differential transmission. The present invention proposes a structure of a transmission circuit board suitable for the differential transmission.

Non-Patent Reference 1 and Patent Reference 1 have disclosed a series of terminal portions (so-called foot pattern) formed on circuit board surfaces as a land suitable for such an application.

Figure 8A:
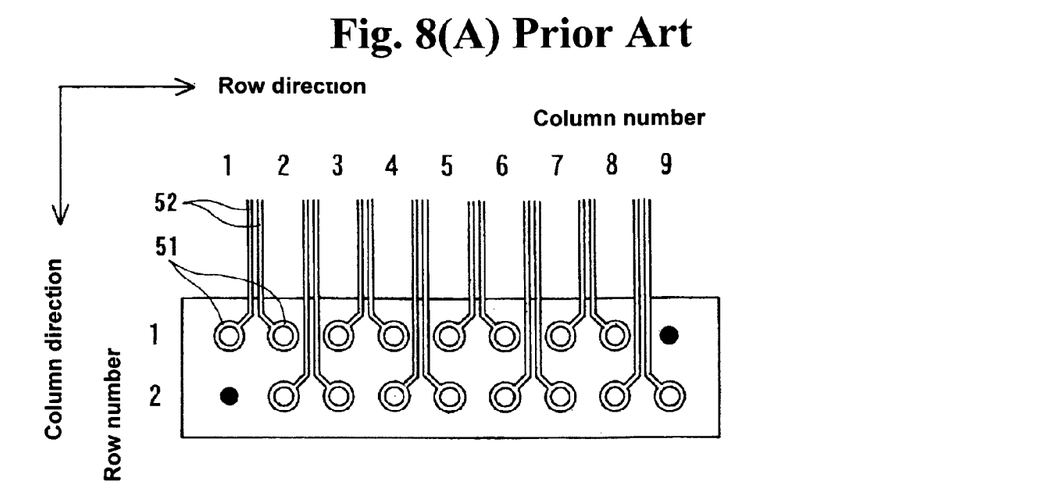

In Non-Patent Reference 1, as shown in FIG. 8(A), in a transmission circuit board with multi-layered signal layers, one signal layer has terminal portions in a two-row nine-column pattern. It is claimed that pairs of terminal portions 51 in a row direction are arranged alternately at one row to an adjacent row, so that it is possible to obtain an effect by drawing an equal path length of wiring portions 52 (pattern) of the terminal portions constituting P/N.

Figure 8B:
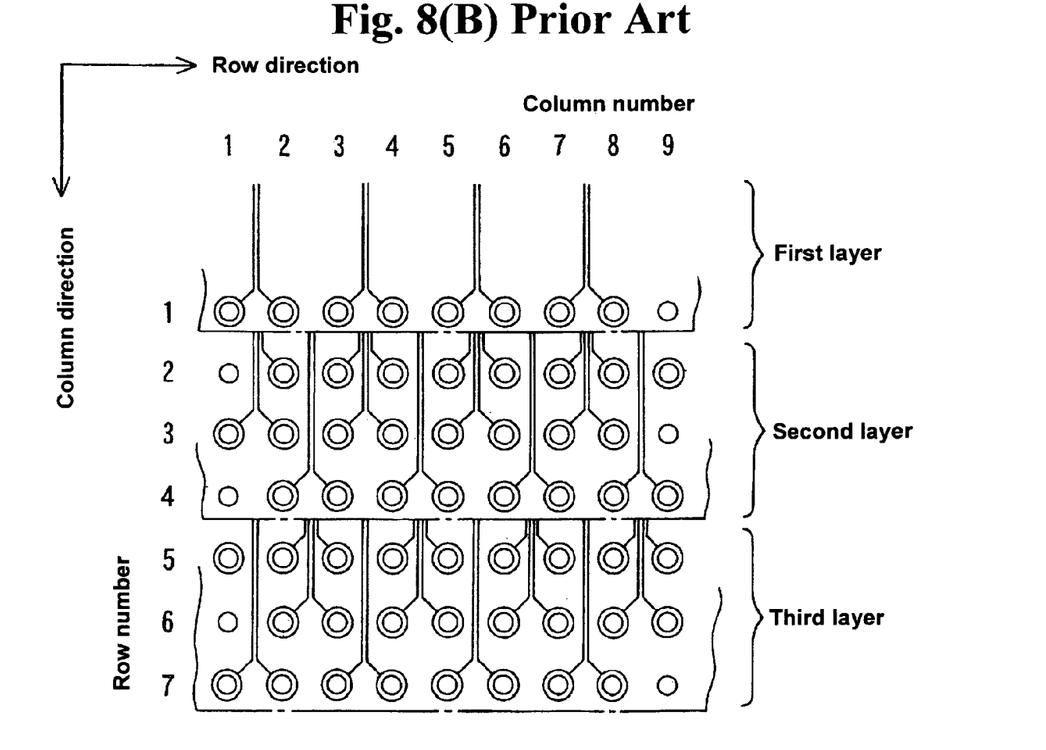

In a principle structure disclosed in Patent Reference 1, as shown in FIG. 8(B), a series of terminals in a seven-row nine-column pattern is divided into three signal layers, i.e., a first layer to a third layer. The structure in Patent Reference 1 is not limited to the differential transmission. When the structure is applied to the differential transmission as shown in FIG. 8(B), wiring portions are shifted with each other and drawn, thereby making it possible to properly arrange the terminal portions and the wiring portions for reducing the number of the signal layers.

Figure 9:
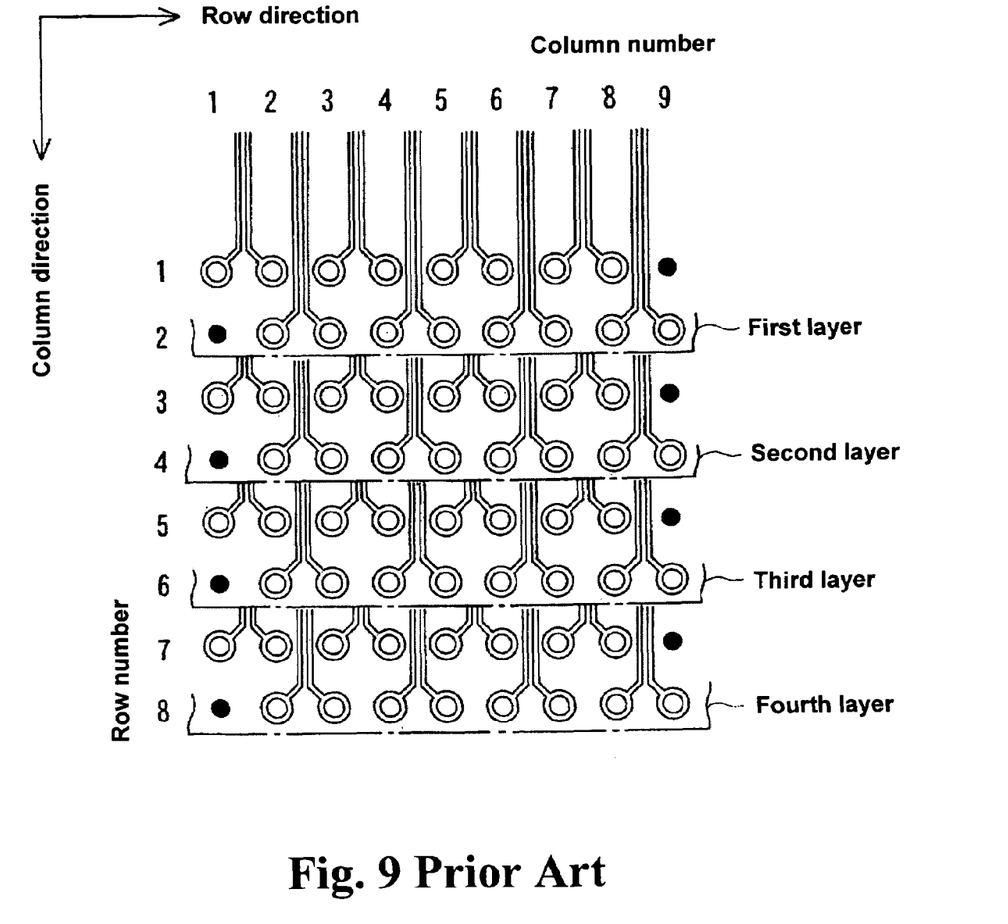
FIG. 9 is a view showing a possible combination of the conventional patterns shown in FIG. 8(A) and FIG. 8(B).

When the structures disclosed in Non-Patent Reference 1 and Patent Reference 1 are combined, as shown in FIG. 9, terminal portions in an eight-row pattern, for example, are arranged to be differential pairs in a row direction. Wiring portions are arranged in a column direction to form four signal layers.

Non-Patent Reference 1: U.S.A. Altera Technical Bulletin "Board Design Guidelines for LVDS Systems" (July, 2000)

Patent Reference 1: Japanese Patent Publication No. 11-74399

When a pattern of a transmission circuit board is configured with the method disposed in Non-Patent Reference 1 or Patent Reference 1, it is possible to obtain multi-layered signal layers suitable for the differential pair. However, when the number of the signal layers increases, there is a room for improvement in terms of increased manufacturing cost and an increased thickness of the substrate as a product.

An object of the present invention is to provide a transmission circuit board applicable to the differential pair and capable of reducing the number of signal layers. Further, an object of the present invention is to provide a connector device having a connector connected to the transmission circuit board.

SUMMARY OF THE INVENTION

According to the present invention, a transmission circuit board comprises: a plurality of signal circuit layers disposed in a insulating plate; a plurality of ground layers disposed in the insulating plate for covering the signal circuit layers through an insulating layer; and a plurality of terminal portions penetrating through at least one of the signal circuit layers and the ground layers in a plate thickness direction and disposed at positions forming a plurality of rows and columns on a board surface. The terminal portions include ground terminal portions situated in both end columns and signal terminal portions. Each of the signal circuit layers includes signal connecting portions extending from circumferential surfaces of the signal terminal portions and wiring portions extending from the signal connecting portions in a column direction at positions of the rows and columns not overlapped with those in an adjacent signal circuit layer. The ground layers are formed in a plate shape extending in parallel to the board surface with a distance from the circumferential surfaces of the signal terminal portions, and are electrically connected to the ground terminal portions.

In the transmission circuit board, according to the present invention, the ground terminal portions are disposed at every other two rows in the both end columns. Each of the signal circuit layers includes at least a pair of adjacent signal connecting portions electrically connected to a pair of the wiring portions arranged in parallel in a row direction or the column direction different from those on an adjacent signal circuit layer. Each of the ground layers is electrically connected to at least one of the ground terminal portions in the both end columns.

With the configuration of the invention, relative to one signal circuit layer, the ground terminal portions are disposed in the end columns, and the signal terminal portions are disposed in two rows. Accordingly, in a space between the rows, it is possible to arrange the wiring portions from a pair of the signal terminal portions on one row forming the space between the rows and the wiring portions extending from the signal terminal portions on another row on both sides of the wiring portions. In another space between the rows, since the ground terminal portions are disposed in another end columns while the signal terminal portions are disposed in another two rows, it is possible to arrange the wiring portions extending from a pair of the signal terminal portions in each row in another space between the rows.

That is, on one layer, it is possible to arrange the wiring portions extending from the signal terminal portions in two rows in every other space between the rows and the wiring portions extending from the signal terminal portions in another two rows in another every other space between the rows. Accordingly, it is possible to draw four wiring portion from the signal terminal portions at maximum four rows on one layer. Therefore, it is possible to form the transmission circuit board with a minimum number of the signal circuit layers relative to a large number of the signal terminal portions. Further, the ground terminal portions are arranged in the both end columns, thereby properly dealing with grounding in each row.

According to the present invention, it is possible to arrange the signal terminal portions in maximum four rows on one layer over a whole area of the transmission circuit board. It is not necessary to form the four rows with two adjacent rows or with four rows on the entire area of the transmission circuit board, and it can be partial. That is, the signal circuit layers may include one signal circuit layer with every four rows in at least a part of an area of the transmission circuit board. The signal connecting portions include pairs of the signal connecting portions arranged with next to each other in the column direction on the one signal circuit layer. In this case, the pairs of the signal connecting portions arranged with next to each other in the column direction may have the wiring portions having an equal length, thereby properly constituting a differential pair.

According to the present invention, the signal connecting portions may include four of the signal connecting portions disposed on one of the signal circuit layers at a first row and a second row in a same column, and a third row and a fourth row in one of the columns shifted from the same column by one column. The wiring portions include a pair of the wiring portions extending in the column direction from a pair of the signal connecting portions disposed in adjacent two columns. The wiring portions in the first row and the second row are arranged in spaces between the columns different from those of the wiring portions in the third row and the fourth row.

Depending on a design request, the signal circuit layers may include pairs of the signal connecting portions arranged next to each other in the row direction except the signal connecting portions arranged next to each other in the column direction. In this case, positions of output ends of the wiring portions may be shifted by a distance between the signal terminal portions, so that the signal connecting portions arranged next to each other in the column direction have the wiring portions having an equal length, thereby obtaining a proper differential pair.

According to the present invention, the signal circuit layers may include a pair of the signal circuit layers at every four rows. The pair includes a first layer in adjacent two of the rows at every three rows and a second layer at another adjacent two of the rows in every three rows. The signal connecting portions include a pair of the signal connecting portions arranged in adjacent rows.

According to the present invention, the signal circuit layers may include one signal circuit layer with every four rows in a part of an area of the transmission circuit board. The signal connecting portions include pairs of the signal connecting portions arranged with next to each other in the row direction on the one signal circuit layer. The signal circuit layers include a pair of the signal circuit layers with every four rows in another part of the area of the transmission circuit board. The pair includes a first layer in adjacent two of the rows in every three rows and a second layer in another adjacent two of the rows in every three rows. The signal connecting portions include pairs of the signal connecting portions being arranged in adjacent rows.

According to the present invention, a connector device comprises a connector connected to one of the transmission circuit boards described above. In this case, in the transmission circuit board, the ground terminal portions are disposed at every other two rows in the both end columns. Each of the signal circuit layers includes at least a pair of adjacent signal connecting portions electrically connected to a pair of the wiring portions arranged in parallel in a row direction or the column direction different from those on an adjacent signal circuit layer. Each of the ground layers is electrically connected to at least one of the ground terminal portions in the both end columns. Ground terminals and signal terminals of the connector are connected to the corresponding ground terminal portions and the corresponding signal terminal portions of the transmission circuit board, respectively.

In the present invention, as described above, the transmission circuit board comprises a plurality of the signal circuit layers and a plurality of the terminal portions disposed positions forming a plurality of rows and columns pattern on the board surface. The terminal portions in both end columns are used as the ground terminal portions, and the other terminal portions are used as the signal terminal portions. Accordingly, it is possible to arrange the signal terminal portions in four rows on one layer. Therefore, as compared with the conventional one, it is possible to reduce the number of layers and cost, and to make the board thin. When a connector is connected to such a transmission circuit board, it is possible to obtain a connector device with a small size as a whole.

BRIEF DESCRIPTION OF THE DRAWINGS

FIGS. 3(A) and 3(B) are sectional views showing a transmission circuit board having the pattern shown in FIG. 2, wherein FIG. 3(A) is a horizontal sectional view, FIG. 3(B) is a vertical sectional view, and A-A and B-B in the figures are sectional planes of FIG. 3(A) and FIG. 3(B), respectively;

FIGS. 8(A) and 8(B) are views showing conventional patterns, wherein FIG. 8(A) shows an example, and FIG. 8(B) shows another example.

DETAILED DESCRIPTION OF THE PREFERRED EMBODIMENTS

Hereunder, embodiments of the present invention will be explained with reference to the accompanying drawings from FIG. 1 to FIG. 7.

First Embodiment

Figure 1:
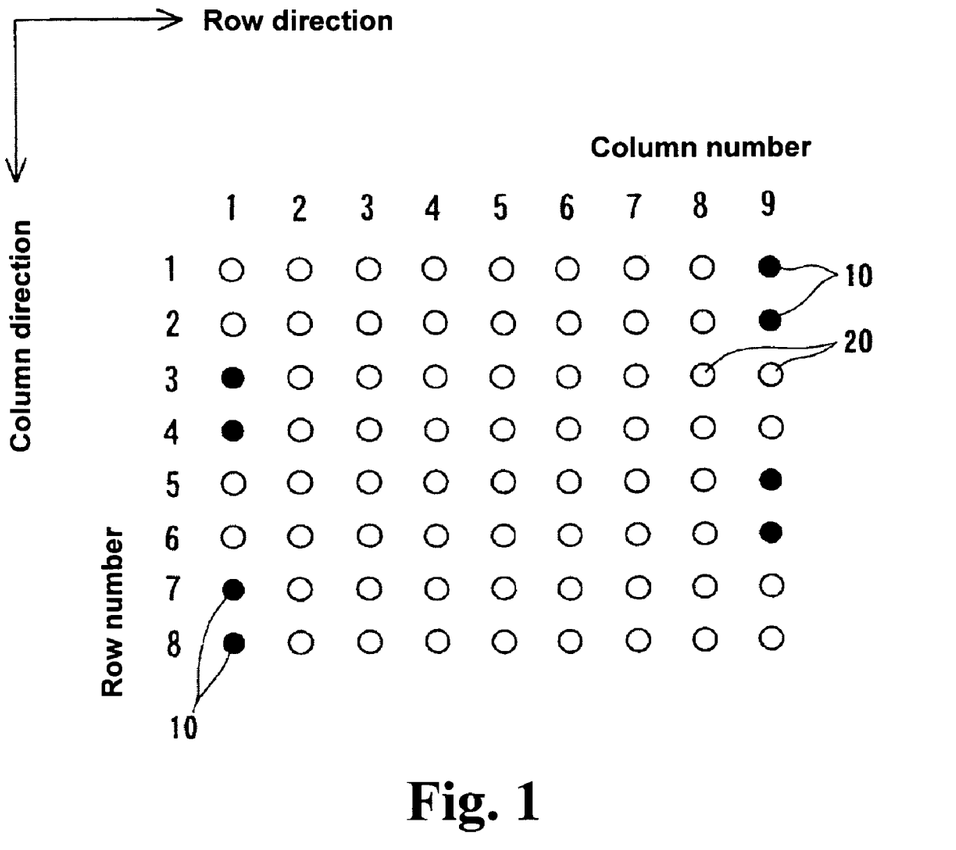
FIG. 1 is a view showing a basic pattern of a terminal portion arrangement of a transmission circuit board according to the present invention.

FIG. 1 is a view showing an arrangement of terminal portions of a transmission circuit board according to an embodiment of the present invention. This arrangement is basic one in the present invention, and is common for other embodiments.

In the arrangement, the terminal portions are disposed to penetrate through the transmission circuit board having signal circuit layers and ground layers forming a multi-layered structure.

As shown in FIG. 1, a lateral direction represents a row direction, and a vertical direction represents a column direction. That is, in the present embodiment, the terminal portions are arranged in an eight-row nine-column pattern.

Needless to say, it is possible to arrange in a pattern having more or less rows and columns.

In FIG. 1, empty circles represent signal terminal portions, and closed circles represent ground terminal portions. In the present invention, the ground terminal portions 10 are arranged alternately every two rows at both ends, i.e., first and ninth columns. That is, the ground terminals 10 are arranged at the first and second rows in the ninth column of the right end, and are arranged at the third and fourth rows in the first column of the left end. Such a pattern of the first to fourth rows is repeated every four rows, and the fifth to eight rows are formed as same as the first to fourth rows. In Non-Patent Reference 1, it is disclosed that the ground terminal portions need to be disposed at the both ends, i.e., the first and ninth columns. In the pattern shown in FIG. 1, positions other than the ground terminal portions 10 can be used for the signal terminal portions 20.

Figure 2:
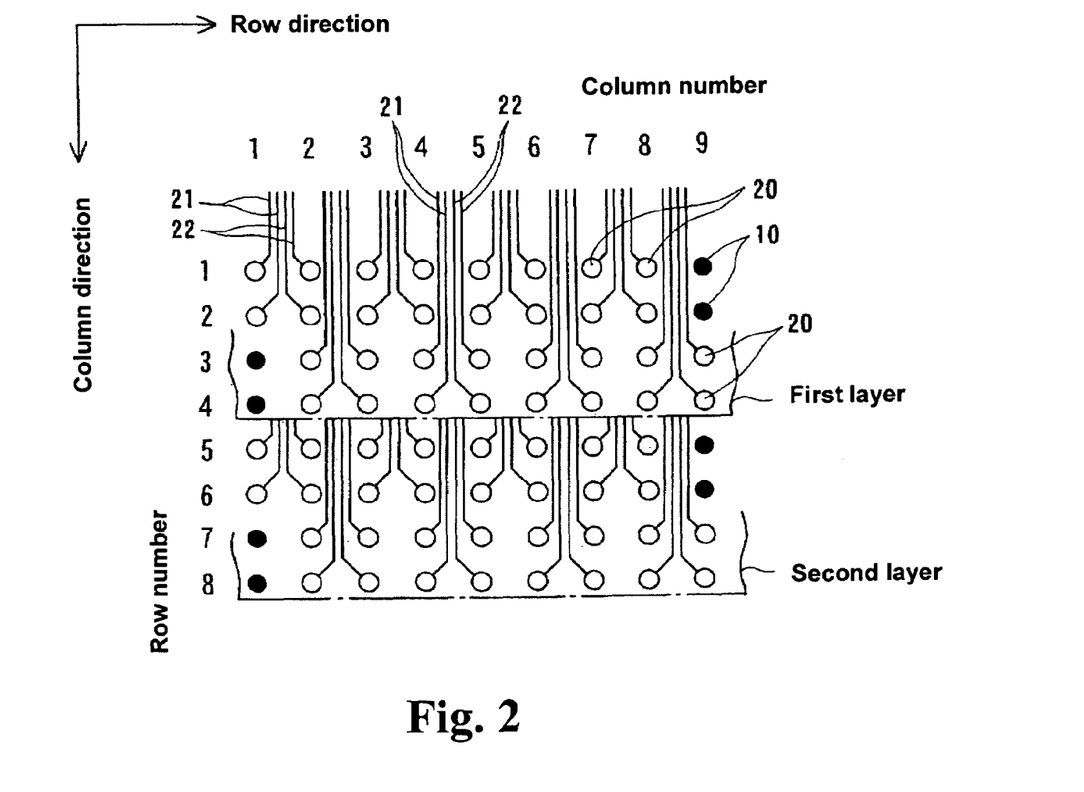
FIG. 2 is a view showing a pattern according to a first embodiment.

FIG. 2 is a view showing the terminal portions in each layer. In FIG. 2, based on the arrangement shown in FIG. 1, the terminal portions are arranged in the eight-row nine-column pattern, and are indicated by the closed circles. That is, the ground terminals 10 are situated at the first and second rows in the ninth column, at the third and fourth rows in the first column, at the fifth and sixth rows in the ninth column, and at the seventh and eighth rows in the first column. The signal terminal portions 20 are disposed at all of the other positions.

The circuit board has the first layer including the first to fourth rows and the second layer including the fifth to eighth rows.

The signal terminal portions 20 are paired at the first and second rows, and the third and fourth rows in the first layer, and at the fifth and sixth rows, and the seventh and eighth rows in the second layer. Each pair has wiring portions 21 and 22 connected to the corresponding signal terminals 20 and extending in the row direction. The wiring portions 21 and 22 extend to near an end portion of the circuit board, and are connected to output portions (not shown) on a surface layer. The wiring portion 22 of the second row has a length larger than that of the wiring portion 21 of the first row. In this case, the two paired wiring portions have slightly different lengths up to the output portions. However, the difference is small enough to ignore an effect on a property unless high frequency is used. In the case of high frequency, the output portions may be slightly shifted by the difference to eliminate the difference.

The ground terminal portions 10 are arranged at the first and second rows in the ninth column on the right end, and at the third and fourth rows in the first column on the left end. Accordingly, the signal terminal portions 20 are paired at the third and fourth rows shifted from the signal terminal portions at the first and second rows by one column in the row direction. As a result, the wiring portions are shifted in the same way, and are disposed in spaces between the columns where the wiring portions 21 and 22 of the signal terminals 20 are not arranged.

As described above, the wiring portions 21 and 22 of the signal terminal portions 20 at the fourth row in the ninth column are arranged on the first layer. The second layer has an arrangement same as that on the first layer.

Figure 3A:
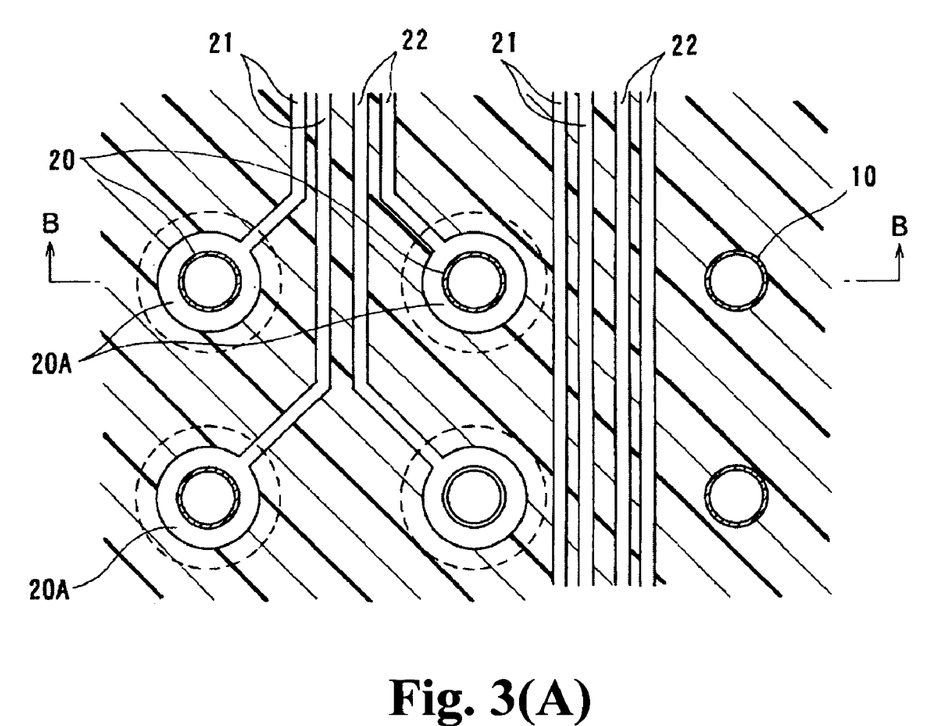
Figure 3B:
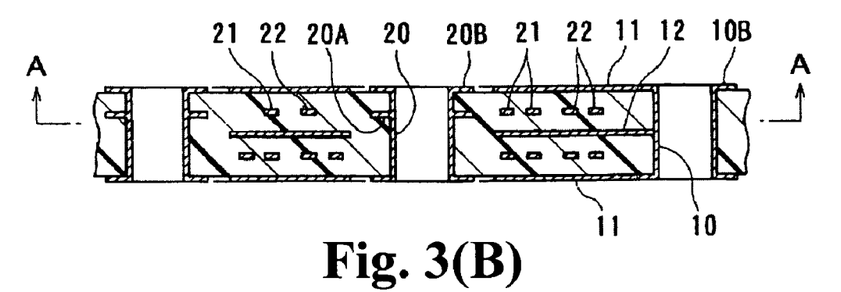

FIG. 3 shows sectional views of a part of the circuit board shown in FIG. 2. FIG. 3(A) is a horizontal sectional view (section taken along a plane in parallel to the board surface) of the first layer at the first and second rows in the seventh to ninth columns. FIG. 3(B) is a vertical sectional view (section in a thickness direction of the board). A-A and B-B in the figures are sectional planes of FIG. 3(A) and FIG. 3(B), respectively.

As shown in FIG. 3(A) and FIG. 3(B), the terminal portions, i.e., the ground terminal portions 10 and the signal terminal portions 20, penetrate through a base member 30 formed of an insulating material having a plate shape in a plate thickness direction, and are formed in a cylindrical shape. The terminal portions have protruding portions 10B and 20B with a cylindrical shape at upper and lower surfaces, respectively, for soldering with terminals of a corresponding connector.

The signal terminal portions 20 have signal connecting portions 20A in each signal circuit layer. The signal connecting portions 20A have a flange shape around the signal terminal portions 20 with a cylindrical shape. The wiring portions 21 and 22 extend from the signal connecting portions 20A arranged in pair in the column direction, respectively. In FIG. 2, the signal connecting portions with a flange shape are omitted, and the wiring portions are directly connected to the signal terminal portions. As shown in FIG. 3(B), ground layers 11 and 12 are disposed on outer upper and lower surfaces of the board between the signal circuit layers on the first layer and the second layer. The ground layers 11 and 12 extend over substantially the whole area while forming a slight gap from the signal terminal portions 20, and are electrically connected to the ground terminal portions 10.

As shown in FIG. 3(A), the wiring portions on the left side (the wiring portions on the first layer in FIG. 3(B)) are the wiring portions 21 and 22 extending from the signal terminal portions 20 at the first and second rows in the seventh and eighth columns in FIG. 2. The wiring portions on the right side in FIG. 3(A) are the wiring portions 21 and 22 extending from the signal terminal portions 20 (not shown in FIG. 3(B)) at the third and fourth rows in the eighth and ninth columns in FIG. 2.

Accordingly, as shown in FIG. 2 and FIGS. 3(A) and 3(B), in the transmission circuit board according to the present invention, the terminal portions in the adjacent columns are paired, and the wiring portions are drawn in the column direction between the columns. Accordingly, all of the terminal portions constitute one layer per every four rows. As a result, in the present embodiment, the signal terminal portions in the eight rows can be arranged in just two layers.

Second Embodiment

Figure 4:
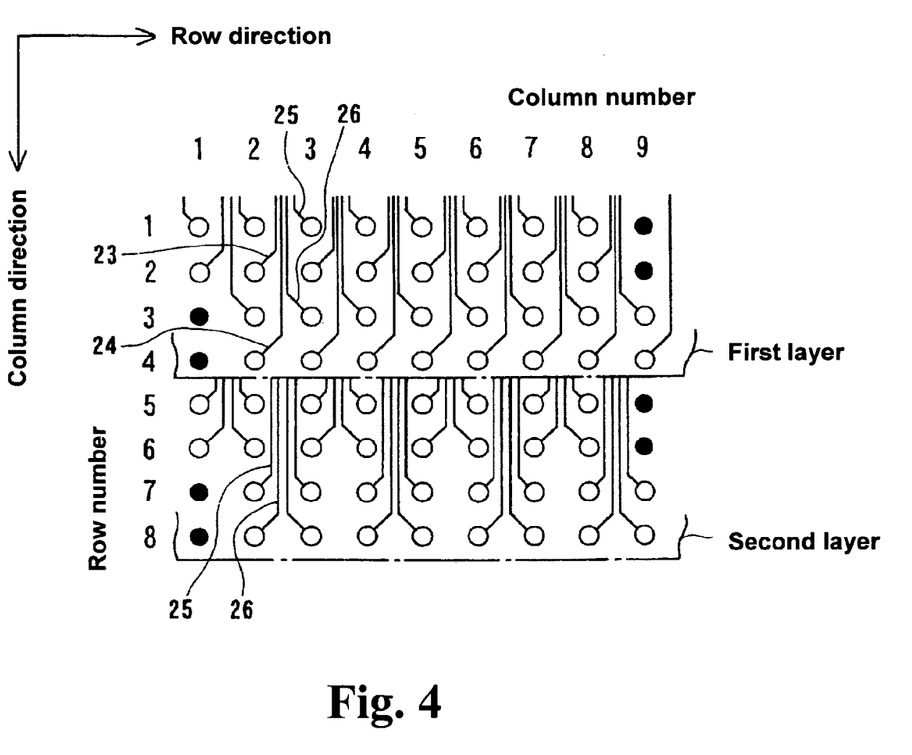
FIG. 4 is a view showing a pattern according to a second embodiment.

In the second embodiment shown in FIG. 4, similar to the first embodiment, the transmission circuit board has the signal terminal portions at the eight rows accommodated on the two layers. In the second embodiment, the signal terminals on the first layer are not paired, and the signal terminal portions on the second layer are the same as those in the first embodiment.

In FIG. 4, wiring portions 23, 24, 25, and 26 on the first layer can be used as a single end. When two signal terminal portions in the adjacent columns are paired, for example, as shown in FIG. 4, the output portions are shifted, so that the wiring portions 25 and 26 paired in the column direction on the second layer have an equal length, thereby properly dealing with differential transmission.

Third Embodiment

Figure 5:
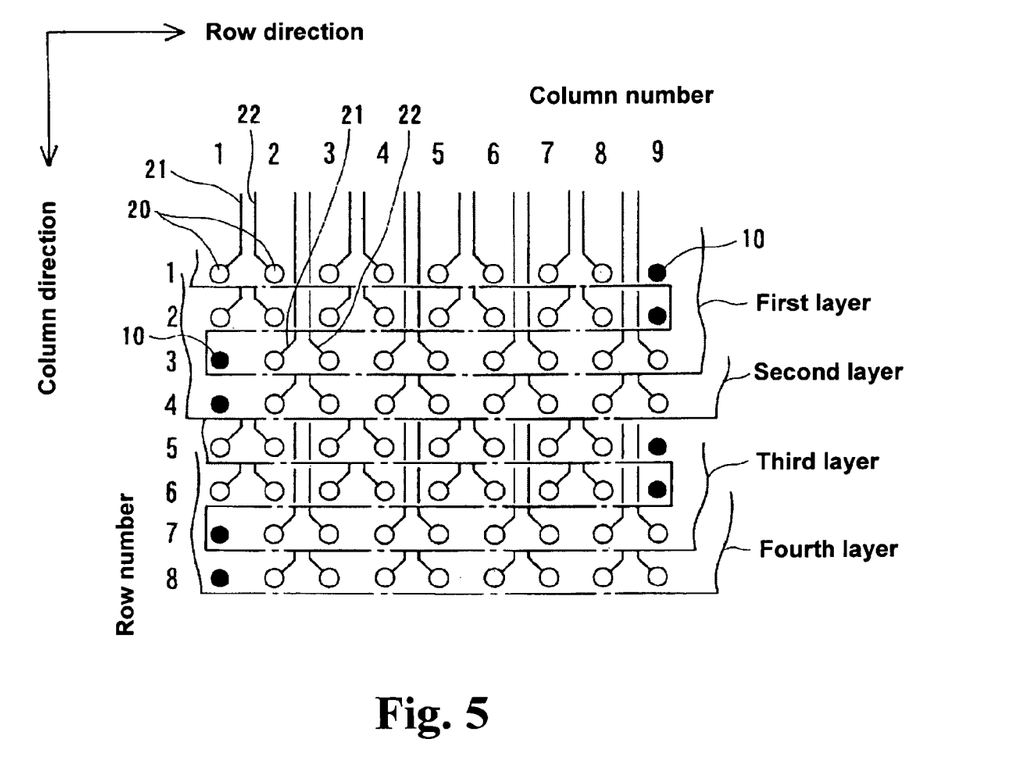
FIG. 5 is a view showing a pattern according to a third embodiment.

In the third embodiment shown in FIG. 5, the signal terminal portions 20 form the signal circuit layer at two adjacent odd number rows and two adjacent even number rows, respectively.

For example, in FIG. 5, the first and third rows form the first layer; the second and fourth rows form the second layer; the fifth and seventh rows form the third layer; and the sixth and eighth rows form the fourth layer. In each layer, the ground terminal portions 10 are disposed in the right end column at a greater number row, and in the left end column at a smaller number row. Accordingly, in each layer, the signal terminal portions in the two adjacent rows are paired. In this case, the pair is shifted with each other by one column. The wiring portions 21 and 22 paired between each column are alternately arranged relative to the two rows.

Fourth Embodiment

Figure 6:
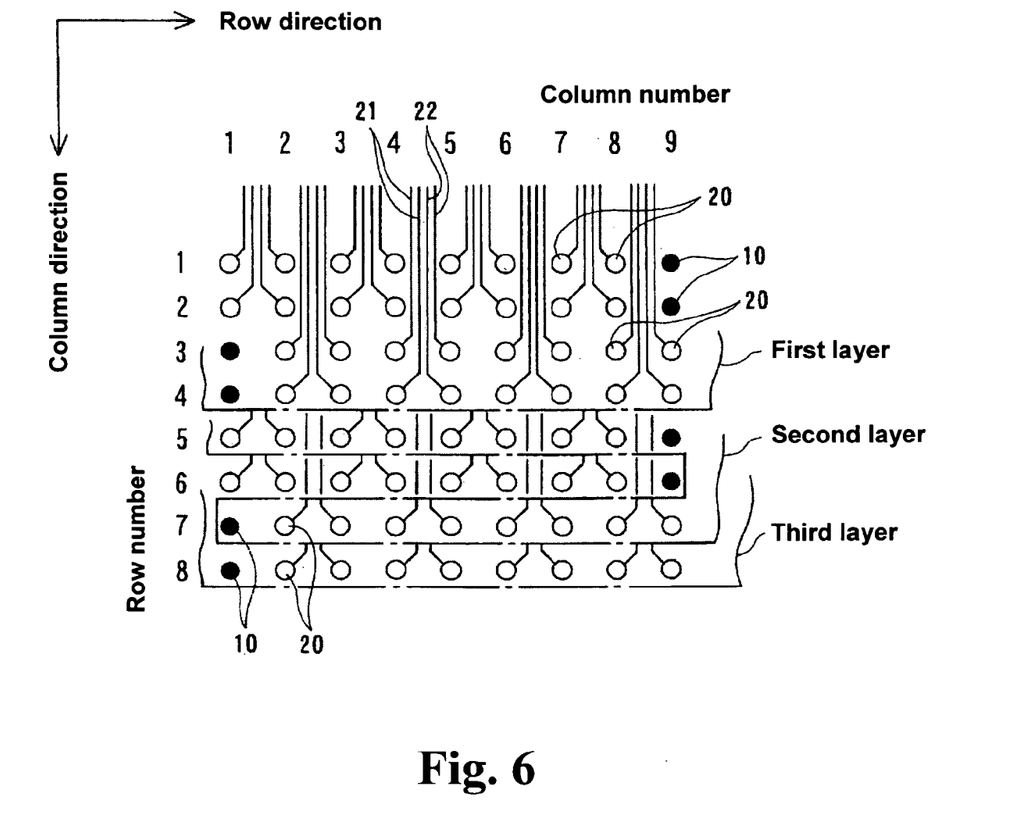
FIG. 6 is a view showing a pattern according to a fourth embodiment.

In the fourth embodiment shown in FIG. 6, the pattern in the first embodiment shown in FIG. 2 and the pattern in the third embodiment shown in FIG. 5 are combined. That is, in FIG. 6, the signal circuit layers are formed of the first to third layers. The first layer has a pattern same as that of the first or second layer shown in FIG. 2. The second and third layers shown in FIG. 6 have patterns same as those of the first and second layers shown in FIG. 5.

Fifth Embodiment

Figure 7:
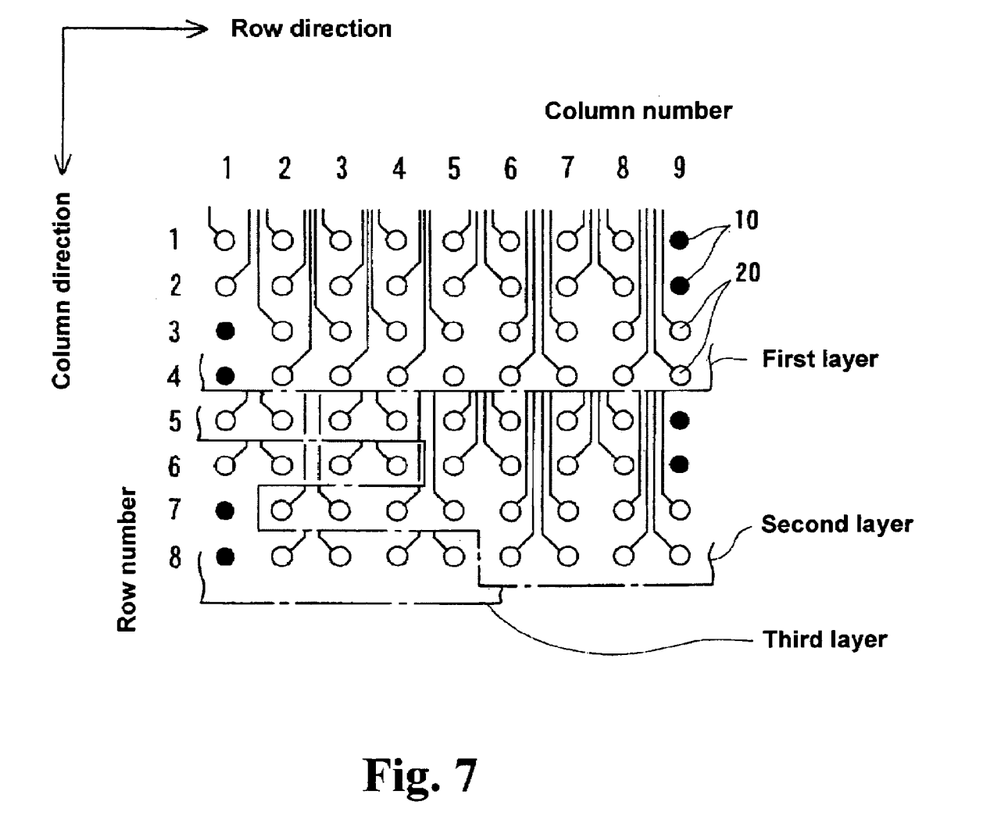
FIG. 7 is a view showing a pattern according to a fifth embodiment.

In the fifth embodiment shown in FIG. 7, several patterns are combined in a more complex manner than the fourth embodiment. In FIG. 7, the signal circuit layers are formed of the first to third layers. The first to fifth columns (only the third and fourth rows in the fifth columns) on the left half of the first layer have patterns same as those of the first to fifth columns (only the third and fourth rows in the fifth columns) on the first layer in the second embodiment shown in FIG. 4. The fifth (the first and second rows) to ninth columns on the right half have patterns same as those in the fifth (the first and second rows) to ninth columns on the first layer in the first embodiment shown in FIG. 2.

Further, the fifth (the first and second rows) to ninth columns on the right half of the second layer have patterns same as those in the fifth (the first and second rows) to ninth columns on the second layer shown in FIG. 2. In FIG. 7, in the first to fifth columns, the third layer and the remaining left half of the second layer have patterns same as those in the first to fifth columns on the third and fourth layers in the third embodiment shown in FIG. 5. As described above, in the embodiments of the present invention, it is possible to select various patterns according to an application of the circuit. The paired signal terminal portions form the differential pairs suitable for the differential transmission. Each of the terminal portions can be used as the single end.

According to the present invention, it is possible to connect a connector having corresponding terminals to each of the transmission circuit boards in the embodiments, thereby constituting a connector device.

What is claimed is:

1. A transmission circuit board, comprising:
   a plurality of signal circuit layers disposed in an insulating plate;
   a plurality of ground layers disposed in the insulating plate for covering the signal circuit layers through an insulating layer; and
   a plurality of terminal portions penetrating through at least one of the signal circuit layers and the ground layers in a plate thickness direction and disposed at positions forming a plurality of rows and columns on a board surface; wherein
   said terminal portions include ground terminal portions situated in both end columns and signal terminal portions and are disposed on the board surface at crossing points of a grid pattern;
   each of said signal circuit layers includes signal connecting portions extending from circumferential surfaces of the signal terminal portions and wiring portions extending from the signal connecting portions in a column direction at positions of the rows and columns not overlapped with those in an adjacent signal circuit layer;
   said ground layers are formed in a plate shape extending in parallel to the board surface with a distance from the circumferential surfaces of the signal terminal portions, and are electrically connected to the ground terminal portions;
   said ground terminal portions are disposed at every other two rows in the both end columns;
   each of said signal circuit layers includes at least a pair of adjacent signal connecting portions electrically connected to a pair of the wiring portions arranged in parallel in a row direction or the column direction different from those on an adjacent signal circuit layer; and
   each of said ground layers is electrically connected to at least one of the ground terminal portions in the both end columns.

2. The transmission circuit board according to claim 1, wherein said signal circuit layers includes one signal circuit layer with every four rows in at least a part of an area of the transmission circuit board, said signal connecting portions including pairs of the signal connecting portions arranged with next to each other in the column direction on the one signal circuit layer.

3. The transmission circuit board according to claim 2, wherein said signal connecting portions include four of the signal connecting portions disposed on the one signal circuit layer at a first row and a second row in a same column, and a third row and a fourth row in one of the columns shifted from the same column by one column, said wiring portions including a pair of the wiring portions extending in the column direction from one of the pairs of the signal connecting portions disposed in adjacent two columns, said wiring portions in the first row and the second row being arranged in spaces between the columns different from those of the wiring portions in the third row and the fourth row.

4. The transmission circuit board according to claim 2, wherein said signal circuit layers include the pairs of the signal connecting portions arranged next to each other in the row direction except the signal connecting portions arranged next to each other in the column direction.

5. The transmission circuit board according to one of claim 1, wherein said signal circuit layers include a pair of the signal circuit layers at every four rows, said pair including a first layer at adjacent two of the rows in every three rows and a second layer at another adjacent two of the rows in every three rows, said signal connecting portions including pairs of the signal connecting portions arranged in adjacent rows.

6. The transmission circuit board according to claim 1, wherein said signal circuit layers include one signal circuit layer at every four rows in a part of an area of the transmission circuit board, said signal connecting portions including pairs of the signal connecting portions arranged with next to each other in the row direction on the one signal circuit layer, said signal circuit layers including a pair of the signal circuit layers at every four rows in another part of the area of the transmission circuit board, said pair including a first layer in adjacent two of the rows in every three rows and a second layer in another adjacent two of the rows in every three rows, said signal connecting portions including pairs of the signal connecting portions being arranged in adjacent rows.

7. A connector device comprising:
a connector having ground terminals and signal terminals and connected to a transmission circuit board,
said transmission circuit board comprising:
a plurality of signal circuit layers disposed in an insulating plate;
a plurality of ground layers disposed in the insulating plate for covering the signal circuit layers through an insulating layer; and
a plurality of terminal portions penetrating through at least one of the signal circuit layers and the ground layers in a plate thickness direction and disposed at positions forming a plurality of rows and columns on a board surface; wherein
said terminal portions include ground terminal portions situated in both end columns and signal terminal portions and are disposed on the board surface at crossing points of a grid pattern;
each of said signal circuit layers includes signal connecting portions extending from circumferential surfaces of the signal terminal portions and wiring portions extending from the signal connecting portions in a column direction at positions of the rows and columns not overlapped with those in an adjacent signal circuit layer;
said ground layers are formed in a plate shape extending in parallel to the board surface with a distance from the circumferential surfaces of the signal terminal portions, and are electrically connected to the ground terminal portions;
said ground terminal portions are disposed at every other two rows in the both end columns;
each of said signal circuit layers includes at least a pair of adjacent signal connecting portions electrically connected to a pair of the wiring portions arranged in parallel in a row direction or the column direction different from those on an adjacent signal circuit layer;
each of said ground layers are electrically connected to at least one of the ground terminal portions in the both end columns; and
said ground terminals and said signal terminals of the connector are connected to the corresponding ground terminal portions and the corresponding signal terminal portions of the transmission circuit board, respectively.

8. The connector device according to claim 7, wherein each of said signal circuit layers includes at least the pair of the adjacent signal connecting portions adopted to send a signal through differential transmission.

9. A transmission circuit board comprising:
a plurality of signal circuit layers disposed in an insulating plate;
a plurality of ground layers disposed in the insulating plate for covering the signal circuit layers through an insulating layer; and
a plurality of terminal portions penetrating through at least one of the signal circuit layers and the ground layers in a plate thickness direction and disposed at positions forming a plurality of rows and columns on a board surface; wherein
said terminal portions include ground terminal portions situated in both end columns and signal terminal portions;
each of said signal circuit layers includes signal connecting portions extending from circumferential surfaces of the signal terminal portions and wiring portions extending from the signal connecting portions in a column direction at positions of the rows and columns not overlapped with those in an adjacent signal circuit layer;
said ground layers are formed in a plate shape extending in parallel to the board surface with a distance from the circumferential surfaces of the signal terminal portions, and are electrically connected to the ground terminal portions;
said ground terminal portions are disposed at every other two rows in the both end columns;
each of said signal circuit layers includes at least a pair of adjacent signal connecting portions adopted to send a signal through differential transmission and electrically connected to a pair of the wiring portions arranged in parallel in a row direction or the column direction different from those on an adjacent signal circuit layer; and
each of said ground layers is electrically connected to at least one of the ground terminal portions in the both end columns.

10. The transmission circuit board according to claim 9, wherein said signal circuit layers includes one signal circuit layer with every four rows in at least a part of an area of the transmission circuit board, said signal connecting portions including pairs of the signal connecting portions arranged with next to each other in the column direction on the one signal circuit layer.

11. The transmission circuit board according to claim 10, wherein said signal connecting portions include four of the signal connecting portions disposed on the one signal circuit layer at a first row and a second row in a same column, and a third row and a fourth row in one of the columns shifted from the same column by one column, said wiring portions including a pair of the wiring portions extending in the column direction from one of the pairs of the signal connecting portions disposed in adjacent two columns, said wiring portions in the first row and the second row being arranged in spaces between the columns different from those of the wiring portions in the third row and the fourth row.

* * * * *